United States Patent
He et al.

(10) Patent No.: US 12,020,630 B1
(45) Date of Patent: Jun. 25, 2024

(54) STACKED STRUCTURE, DISPLAY SCREEN, AND DISPLAY APPARATUS

(71) Applicant: HUAWEI TECHNOLOGIES CO., LTD., Guangdong (CN)

(72) Inventors: Dapeng He, Dongguan (CN); Wenjin Huang, Dongguan (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 17/975,696

(22) Filed: Oct. 28, 2022

Related U.S. Application Data

(63) Continuation of application No. PCT/CN2021/090892, filed on Apr. 29, 2021.

(30) Foreign Application Priority Data

Apr. 30, 2020 (CN) .......................... 202010362184.1

(51) Int. Cl.
| | |
|---|---|
| G09G 3/20 | (2006.01) |
| G09G 3/32 | (2016.01) |
| H01L 25/075 | (2006.01) |
| H01L 25/16 | (2023.01) |
| H01L 33/62 | (2010.01) |

(52) U.S. Cl.
CPC ........... *G09G 3/32* (2013.01); *H01L 25/0753* (2013.01); *H01L 25/167* (2013.01); *H01L 33/62* (2013.01); *G09G 2300/0426* (2013.01)

(58) Field of Classification Search
CPC .............. G09G 3/32; G09G 2300/0426; H01L 25/0753; H01L 25/167; H01L 33/62
USPC ................................................ 345/55, 56, 79
See application file for complete search history.

(56) References Cited

U.S. PATENT DOCUMENTS

| | | | |
|---|---|---|---|
| 10,319,266 B1* | 6/2019 | Percival ............. | G02B 27/0172 |
| 2016/0013170 A1 | 1/2016 | Sakariya et al. | |
| 2018/0261149 A1 | 9/2018 | Lin | |
| 2019/0096864 A1 | 3/2019 | Huitema et al. | |
| 2020/0035046 A1* | 1/2020 | Luke .......................... | B60L 1/00 |
| 2020/0035657 A1 | 1/2020 | Qu et al. | |
| 2020/0274025 A1* | 8/2020 | Wang ................. | G02F 1/133514 |

(Continued)

FOREIGN PATENT DOCUMENTS

| | | |
|---|---|---|
| CN | 201910207 U | 7/2011 |
| CN | 103545304 A | 1/2014 |

(Continued)

OTHER PUBLICATIONS

International Search Report and Written Opinion issued in PCT/CN2021/090892, dated Aug. 3, 2021, 10 pages.

(Continued)

*Primary Examiner* — Thuy N Pardo

(57) ABSTRACT

The technology of this disclosure relates to a stacked structure, a display screen, and a display apparatus. The stacked structure includes a substrate, a drive chip, and a pixel unit that are stacked. The substrate has a first surface. A line layer is disposed on the first surface, the drive chip is disposed on a surface that is of the line layer and that faces away from the first surface, and the pixel unit and a corresponding drive chip are stacked. A sub-pixel located in each pixel unit is separately electrically connected to the line layer and the corresponding drive chip to form a light-emitting loop.

20 Claims, 12 Drawing Sheets

(56) References Cited

U.S. PATENT DOCUMENTS

| | | | |
|---|---|---|---|
| 2020/0294752 A1* | 9/2020 | Sun | G06F 3/0421 |
| 2020/0350466 A1* | 11/2020 | Lai | H01L 27/153 |
| 2021/0005158 A1* | 1/2021 | Huang | G09G 3/3208 |
| 2021/0110764 A1* | 4/2021 | Hughes | H01L 25/0753 |
| 2021/0233457 A1* | 7/2021 | Xiong | G09G 3/2074 |
| 2021/0280741 A1* | 9/2021 | Lo | H01L 25/0753 |
| 2022/0278086 A1* | 9/2022 | Bibl | G04G 9/10 |
| 2023/0361098 A1* | 11/2023 | Bibl | G06F 3/042 |

FOREIGN PATENT DOCUMENTS

| | | |
|---|---|---|
| CN | 107155373 A | 9/2017 |
| CN | 110416171 A | 11/2019 |
| CN | 110600463 A | 12/2019 |
| CN | 210167355 U | 3/2020 |
| JP | 2010232577 A | 10/2010 |
| JP | 2012060133 A | 3/2012 |
| JP | 2012227514 A | 11/2012 |

OTHER PUBLICATIONS

Office Action issued in JP2022-565957 with English translation, dated Sep. 19, 2023, 10 pages.

Extended European Search Report issued in EP21797561.4, dated Nov. 8, 2023, 9 pages.

\* cited by examiner

STACKED STRUCTURE, DISPLAY SCREEN, AND DISPLAY APPARATUS

CROSS-REFERENCE TO RELATED APPLICATIONS

This disclosure is a continuation of International Application No. PCT/CN2021/090892, filed on Apr. 29, 2021, which claims priority to Chinese Patent Application No. 202010362184.1, filed on Apr. 30, 2020. The disclosures of the aforementioned applications are hereby incorporated by reference in their entireties.

TECHNICAL FIELD

This disclosure relates to the field of display apparatus technologies, and in particular, to a stacked structure, a display screen, and a display apparatus.

BACKGROUND

A micro light-emitting diode (micro LED) is a new display technology. The micro LED is intended to thin, miniaturize, and array light-emitting particles of an LED, so that each unit is less than 100 micrometers, and each element can be separately addressed and separately driven to emit light, which is commonly known as self-lumination. The micro LED is similar to an OLED (OrganicElectroluminesence Display, Organic Light-Emitting Semiconductor), but a service life of the micro LED is longer than that of an OLED screen. In addition, a response speed of the micro LED can reach a nanosecond level, and is higher than that of the OLED. In addition, the micro LED further has a plurality of advantages, such as high brightness, low power consumption, and ultra-high resolution. In summary, the micro LED is more advantageous than the OLED.

Currently, a general structure of a display panel of an existing micro LED is as follows:

The display panel includes several display pixels, and each pixel includes light-emitting particles of three colors red, green, and blue (RGB), or includes a micro driver unit (WC). Currently, for the μIC, a physical assembly structure of the light-emitting particles differs in design from a connection manner between the light-emitting particles and a display driver IC. This directly causes a poor display effect and performance of the entire display panel.

SUMMARY

This disclosure provides a stacked structure, a display screen, and a display apparatus, to improve a display effect of the display screen.

According to a first aspect, a stacked structure is provided, and the stacked structure is applied to a display screen, and is used as a display structure in the display screen. A structure of the stacked structure mainly includes a substrate, a drive chip, and a pixel unit. The substrate, the drive chip, and the pixel unit are stacked, and each drive chip corresponds to at least one pixel unit. The substrate has a first surface. A line layer is disposed on the first surface, the drive chip is disposed on a surface that is of the line layer and that faces away from the first surface, and the pixel unit and a corresponding drive chip are stacked. A sub-pixel located in each pixel unit is separately electrically connected to the line layer and the corresponding drive chip to form a light-emitting loop. It can be learned from the foregoing description that, when the pixel unit and the drive chip are stacked, the drive chip and the pixel unit may be located at different layers, more drive chips may be arranged on the substrate, and more pixel units may also be arranged on the drive chips. The entire stacked structure may form an entire layer of pixel units, and the drive chips do not occupy an arrangement area of the pixel units, thereby increasing a quantity of the arranged pixel units, and further improving a display effect of the display screen.

In a specific implementable solution, an area in which the drive chip is disposed on the line layer is not electrically connected to, or is insulated from the drive chip. When the area corresponding to the drive chip is not electrically connected to, or is insulated from the drive chip, maintenance may be facilitated.

In a specific implementable solution, inner layer wiring is not arranged in the area in which the drive chip is disposed on the line layer. Maintenance is facilitated.

In a specific implementable solution, a binding post is disposed on the surface that is of each drive chip and that faces away from the line layer. The binding post is electrically connected to the drive chip and the line layer. The drive chip is connected to the line layer through the binding post.

In a specific implementable solution, the sub-pixel corresponding to each drive chip is disposed on the surface that is of the corresponding drive chip and that faces away from the line layer. The drive chip directly carries the sub-pixel of the corresponding pixel unit.

In a specific implementable solution, a first packaging layer corresponding to each drive chip is further included, and each first packaging layer packages the corresponding drive chip.

The sub-pixel corresponding to each drive chip is disposed on the first packaging layer. An area for disposing the pixel unit is expanded by using the first packaging layer, so that a quantity of the pixel units connected to the drive chip is increased.

In a specific implementable solution, each drive chip corresponds to a plurality of pixel units, and the plurality of pixel units are arranged in two rows. This expands an area for disposing the pixel units.

In a specific implementable solution, a second packaging layer corresponding to each drive chip is further included, and each second packaging layer packages the corresponding drive chip and a plurality of sub-pixels. The second packaging layer enhances protection for the sub-pixels and the drive chip.

In a specific implementation solution, a separation layer is further included, and the separation layer is disposed between the line layer and the substrate. This facilitates replacement or maintenance of the line layer.

In a specific implementable solution, each pixel unit includes three sub-pixels, and the three sub-pixels are respectively sub-pixels that can emit red, blue, and green colors.

In a specific implementable solution, each sub-pixel includes a light-emitting layer and a P pole and an N pole that are separately connected to the light-emitting layer. The P pole is connected to the corresponding drive chip, and the N pole is connected to the line layer. Alternatively, the P pole is connected to the line layer, and the N pole is connected to the corresponding drive chip. Display is implemented by using the sub-pixel.

In a specific implementable solution, the P pole, the light-emitting layer, and the N pole are stacked, and the light-emitting layer is located between the P pole and the N pole. A volume of the sub-pixel is reduced by using the stacked structure.

In a specific implementable solution, the P pole, the light-emitting layer, and the N pole are stacked, and the P pole and the N pole are disposed on a same layer. Power is supplied in a horizontal direction.

According to a second aspect, a display screen is provided. The display screen includes a housing and the stacked structure that is disposed inside the housing and that is described in any one of the foregoing implementable solutions. It can be learned from the foregoing description that, when the pixel unit and the drive chip are stacked, the drive chip and the pixel unit may be located at different layers, more drive chips may be arranged on the substrate, and more pixel units may also be arranged on the drive chips. The entire stacked structure may form an entire layer of pixel units, and the drive chips do not occupy an arrangement area of the pixel units, thereby increasing a quantity of the arranged pixel units, and further improving a display effect of the display screen.

According to a third aspect, a display apparatus is provided. The display apparatus includes a body and the stacked structure that is disposed inside the body and that is described in any one of the foregoing implementable solutions. It can be learned from the foregoing description that, when the pixel unit and the drive chip are stacked, the drive chip and the pixel unit may be located at different layers, more drive chips may be arranged on the substrate, and more pixel units may also be arranged on the drive chips. The entire stacked structure may form an entire layer of pixel units, and the drive chips do not occupy an arrangement area of the pixel units, thereby increasing a quantity of the arranged pixel units, and further improving a display effect of the display screen.

BRIEF DESCRIPTION OF DRAWINGS

FIG. 8b is an example sectional view of a line A-A in FIG. 8a;

FIG. 9b is an example sectional view of a line A-A in FIG. 9a;

FIG. 10b is an example sectional view of a line A-A in FIG. 10a;

FIG. 11b is an example sectional view of a line A-A in FIG. 11a;

FIG. 12b is an example sectional view of a line A-A in FIG. 12a;

DESCRIPTION OF EMBODIMENTS

To make objectives, technical solutions, and advantages of this disclosure clearer, the following further describes this disclosure in detail with reference to the accompanying drawings.

Figure 1:
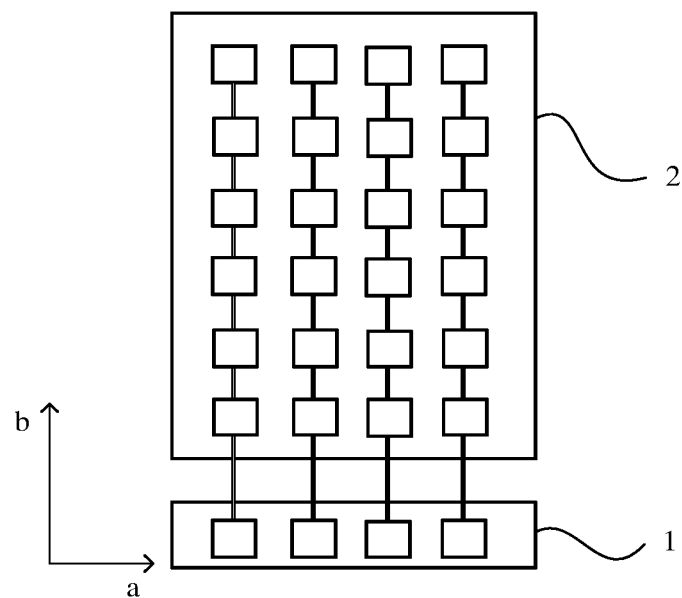
FIG. 1 is an example schematic diagram of a structure of a display screen according to an embodiment of this disclosure.

A stacked structure 2 provided in an embodiment of this disclosure is applied to a display screen. As shown in FIG. 1, currently, an existing display screen panel includes several display pixels. The display screen has a plurality of display pixels 2, and the plurality of display pixels 2 are arranged in rows along a direction a and in columns along a direction b. The plurality of display pixels 2 are located in a display area of the display screen, and implement a display function of the display screen through light emitting of the display pixels 2. The plurality of display pixels 2 are connected to a display driving integrated circuit (DDIC 1) of the display screen, and voltage control of the stacked structure 2 is performed by using a driving signal of the DDIC 1, thereby implementing image display of the entire display screen.

Figure 2:
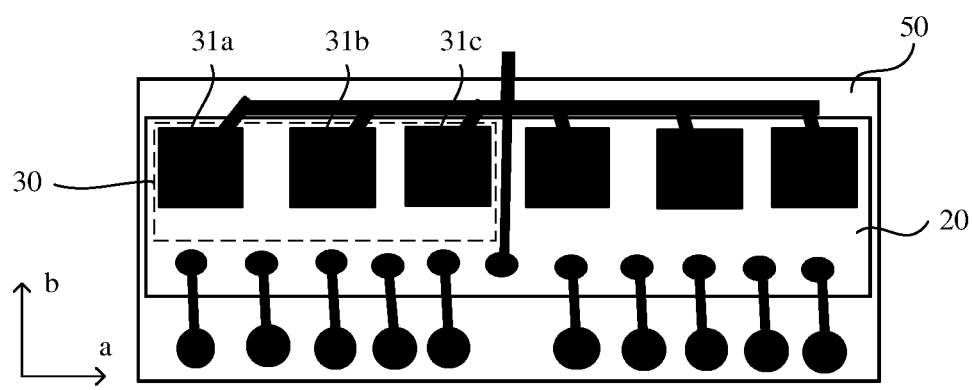
FIG. 2 is an example top view of a stacked structure according to an embodiment of this disclosure.

First, refer to FIG. 2. FIG. 2 is a top view of a stacked structure according to an embodiment of this disclosure. The stacked structure provided in this embodiment of this disclosure includes a substrate (not shown in FIG. 2), a line layer 50, a drive chip 20, and a pixel unit 30, and the drive chip 20 and the pixel unit 30 constitute a light-emitting unit in the stacked structure. As a bearing structure, the substrate provides a base (support) function for the light-emitting unit (the drive chip 20 and the pixel unit 30). The substrate may be made of a material that has a specific support intensity. For example, a material of the substrate may be glass, silicon, sapphire, or PI (polyimide, which is a polymer containing an imide group in the main chain). The line layer 50 is stacked with the substrate and is connected to the drive chip 20 and the pixel unit 30. The line layer 50 is further connected to the DDIC to implement electrical connection between the DDIC and the light-emitting unit.

The drive chip 20 is disposed on the substrate. The substrate shown in FIG. 2 carries a drive chip 20. The drive chip 20 is of a rectangular shape, and a length direction of the drive chip 20 is arranged in the direction a. The drive chip 20 may be a micro integrated circuit (WC).

In this disclosure, a quantity of the drive chips 20 carried on the substrate is not specifically limited. For example, in an optional solution, the substrate may further carry two, three, four, or five drive chips 20. In a specific implementation solution, all stacked structures in the display screen may share one substrate. The drive chips 20 in the display screen are arranged in arrays on the substrate, and the drive chips 20 are electrically connected to the substrate, and are connected to the DDIC through the substrate.

A pixel unit 30 is disposed in the drive chip 20. The drive chip 20 shown in FIG. 2 carries two pixel units 30, and the two pixel units 30 are arranged in a direction a. However, a quantity of pixel units 30 carried on the drive chip 20 is not limited in this embodiment of this disclosure. For example, the drive chip 20 may carry a different quantity of pixel units 30, for example, one pixel unit 30, three pixel units 30, or four pixel units 30. When the drive chip 20 carries a plurality of pixel units 30, the plurality of pixel units 30 are arranged in a single row in the direction a.

Different pixel units 30 have a same structure. Each pixel unit 30 includes three sub-pixels disposed at a same layer, and the three sub-pixels are arranged in a single row in the direction a. The three sub-pixels are respectively sub-pixels that can emit red, blue, and green colors. The three sub-pixels shown in FIG. 2 are respectively a first sub-pixel 31a that can emit red light, a second sub-pixel 31b that can emit blue light, and a third sub-pixel 31c that can emit green light. The drive chip 20 can control the pixel unit 30 to emit light of different colors by controlling working statuses of the three sub-pixels.

In an optional implementation solution, the pixel unit 30 may further include other sub-pixels that can meet a requirement that the display screen emits light of different colors, for example, sub-pixels using a monochrome, or sub-pixels using three colors R, G, and B. In this disclosure, a quantity of sub-pixels in each pixel unit 30 and a color of light emitted by each sub-pixel are not specifically limited. During specific setting, the sub-pixel may be set based on a requirement.

Figure 3:
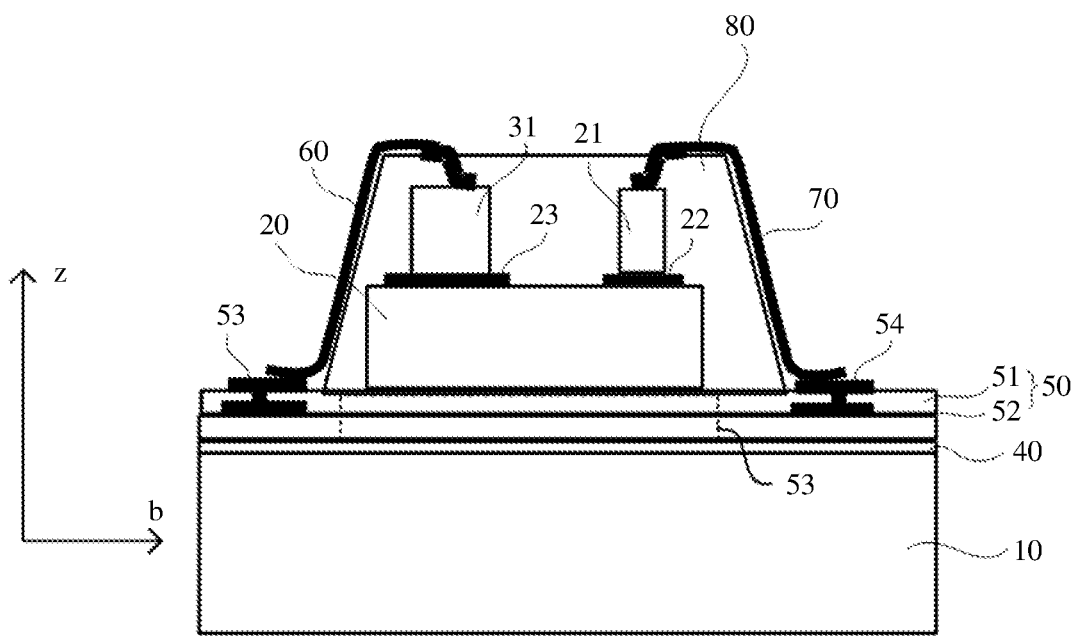
FIG. 3 is an example side view of a stacked structure according to an embodiment of this disclosure.

Also refer to FIG. 3. FIG. 3 is a side view of the stacked structure shown in FIG. 2, and may directly reflect a specific stacking situation of the stacked structure provided in this embodiment of this disclosure. For ease of description, a direction z is defined. The direction z is a direction that is directed from the inside of a display screen to a display surface of the display screen. A substrate 10, a drive chip 20, and a pixel unit are stacked to form a three-layer structure along the direction z, and the pixel unit is close to the display surface of the display screen.

The substrate 10 has a first surface, a line layer 50 is disposed on the first surface, and the line layer 50 has a circuit layer 52 that connects a DDIC, the drive chip 20, and a sub-pixel 31. The line layer 50 shown in FIG. 3 includes a support layer 51 and the circuit layer 52, and the support layer 51 may use different materials. For example, a material of the line layer 50 may be PI or epoxy resin. The circuit layer 52 may be used to perform multilayer wiring inside the support layer 51, or may be used to perform wiring on a surface of the line layer 50. In an optional solution, the circuit layer 52 may be directly disposed on the substrate 10, and the substrate 10 is used as a support structure of the circuit layer 52, so that no additional support layer 51 needs to be prepared to support the circuit layer 52. For example, a printed circuit board or a substrate with a circuit is used.

The drive chip 20 is disposed on the surface that is of the line layer 50 and that faces away from the first surface. Specifically, the drive chip 20 may be fixed to the surface of the line layer 50 through film adhesion, metallic bonding, or paste material adhesion. The drive chip 20 has a binding post 21. The binding post 21 is disposed on the surface that is of the drive chip 20 and that faces away from the line layer 50, and the binding post 21 is electrically connected to the circuit layer 52. Specifically, the binding post 21 is connected to an IO pad 22 of the drive chip 20 by using a connection wire 70. For example, the binding post 21 may be connected to an electrical signal input/output (IO) pad 54 of the line layer 50 by using an Redistribution Layer (RDL), or may be connected to the IO pad 54 of the line layer 50 by using a fanout line, to implement electrical connection between the drive chip 20 and the circuit layer 52. A material of the connection wire 70 may be conductive materials, such as Cu pillar (copper pillar bump), ITO (indium tin oxide), Cu, or Au.

A sub-pixel 31 located in each pixel unit is separately electrically connected to the line layer 50 and a corresponding drive chip 20 to form a light-emitting loop. Specifically, the sub-pixel 31 is assembled on the surface of the drive chip 20 (the surface that faces away from the first surface) by using a transfer process and a bonding process. When the foregoing sub-pixel is specifically disposed, the sub-pixel corresponding to each drive chip is disposed on the surface that is of a corresponding drive chip and that faces away from the line 50. Vertical projections of a plurality of sub-pixels on the first surface are located in a vertical projection of the drive chip on the first surface. The foregoing correspondence is a correspondence between the drive chip and the sub-pixel for forming an electrical connection loop.

Figure 4:
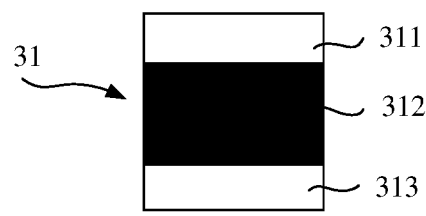
FIG. 4 is an example schematic diagram of a structure of light-emitting particles according to an embodiment of this disclosure.
Figure 5:
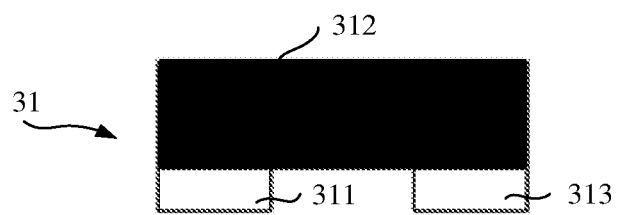
FIG. 5 is an example schematic diagram of another structure of light-emitting particles according to an embodiment of this disclosure.

A structure of the sub-pixel 31 is described with reference to FIG. 4 and FIG. 5. In an optional implementation solution, the sub-pixel may use a micro light-emitting diode (μLED). The sub-pixel 31 provided in this embodiment of this disclosure includes a light-emitting layer 312, and a P pole 313 and an N pole 311 that are separately connected to the light-emitting layer 312. In FIG. 4, the P pole 313, the light-emitting layer 312, and the N pole 311 of the sub-pixel 31 are stacked, and the light-emitting layer 312 is located between the P pole 313 and the N pole 311. When the foregoing vertical stacked structure is used, a volume of the sub-pixel 31 may be reduced, and a size of the sub-pixel 31 may be controlled between 5×5 μm and 100×100 μm. In another structure of the sub-pixel 31 shown in FIG. 5, the sub-pixel 31 is of a flip chip type, that is, the P pole 313, the light-emitting layer 312, and the N pole 311 are stacked, and the P pole 313 and the N pole 311 are disposed at a same layer. The structures shown in FIG. 4 and FIG. 5 may be applied to the stacked structure provided in this embodiment of this disclosure. When the sub-pixel 31 shown in FIG. 4 is applied to the stacked structure shown in FIG. 3, the P pole 313 of the sub-pixel 31 is connected to the P pad 23 of the drive chip. The N pole 311 of the sub-pixel 31 is connected to the GND pad 53 of the line layer 50 by using a connection wire 60. For example, the N pole 311 of the sub-pixel 31 may be connected to the GND pad 53 of the line layer 50 by using an RDL, or may be connected to the GND pad 53 of the line layer 50 by using a fanout line, to implement electrical connection between the sub-pixel 31 and the circuit layer 52. A material of the connection wire 60 may be conductive materials, such as Cu pillar, ITO, Cu, or Au. The drive chip 20 and the sub-pixel 31 are connected to corresponding poles (a GND pad 53 and an IO pad 54) of the drive chip 20 and the sub-pixel 31 on the circuit layer 52 by using the RDL process or the fanout process, to implement a circuit loop of the entire stacked structure. In an optional example, alternatively, the sub-pixel may be connected to the IO pad of the circuit layer, and the IO pad of the drive chip may be connected to the GND pad of the circuit layer. Likewise, the drive chip and the sub-pixel may be electrically connected to the circuit layer.

Still referring to FIG. 3, the stacked structure further includes a separation layer 40 disposed on the substrate. In this embodiment of this disclosure, the separation layer 40 may be used as an optional layer structure. The line layer 50 is disposed on the separation layer 40, and the separation layer 40 may be exfoliated from the substrate. When a damage is detected by the light-emitting unit (the pixel unit or the drive chip 20), the separation layer 40 may be separated through laser exfoliation, to replace a damaged pixel unit. The foregoing separation layer 40 may be made of a laser photosensitive material (for example, potassium nitride or arsenic nitride) or a chemical corrosion material. It should be understood that, to ensure that the light-emitting unit can be separated, an area in which the drive chip 20 is disposed on the line layer 50 is insulated from the drive chip 20. To be specific, when the drive chip 20 is fixed to the line layer 50, no circuit is disposed in an area covered by the drive chip 20. In an optional solution, inner layer wiring is not arranged in the area in which the drive chip 20 is disposed on the line layer 50. As shown in FIG. 3, a first area 53 is the area that covers the drive chip 20 when the drive chip 20 is disposed on the line layer 50. It can be learned from FIG. 3 that, when the light-emitting unit is separated by using the separation layer, the line layer 50 connected to the light-emitting unit needs to be separated together. When inner layer wiring is not arranged in the first area 53, it can be ensured that when the line layer 50 is cut, the line layer part exfoliated together with the drive chip 20 does not have any circuit, and when the repaired drive chip 20 is redisposed on the substrate, the drive chip 20 may be directly placed at an original position.

In an optional solution, the stacked structure further includes a second packaging layer 80 corresponding to each drive chip 20, and each second packaging layer 80 packages a corresponding drive chip 20 and the plurality of sub-pixels 31 to protect the drive chip 20 and the sub-pixels 31. For example, the second packaging layer 80 is of a trapezoidal structure, and wraps the drive chip 20 and the sub-pixels 31. The second packaging layer 80 is made of a transparent plastic packaging material, so that light emitted by the sub-pixels 31 can penetrate through. For example, a material of the second packaging layer 80 may be a COF (Chip On Flex, or, Chip On Film) material, may be a transparent photoresist material, or may be another transparent epoxy resin material. When the stacked structure has the second packaging layer 80, a connection wire that connects the drive chip 20 and the sub-pixels 31 to the circuit layer may be disposed in the second packaging layer 80, and the second packaging layer 80 is used to package the connection wire together with the drive chip 20 and the sub-pixels 31. Alternatively, as shown in FIG. 3, the connection wire may be attached to a surface of the second packaging layer 80. When the light-emitting unit includes the second packaging layer 80, the circuit layer 51 of the line layer 50 has no circuit disposed in an area corresponding to the second packaging layer 80, to ensure that the circuit layer is not damaged when the line layer is cut.

In an optional solution, the binding post 21 may be disposed on the second packaging layer 80 by using a metallic via, or by using a column structure. During actual preparation, a via may be provided in the second packaging layer 80. The via may be plated with a metal layer to form a metallic via, which is used as the binding post, or the via may be filled with a metal material to form a column structure, which is used as the binding post.

In an optional solution, in addition to the foregoing sub-pixels 31, another component or chip of the display screen may be further placed on the drive chip 20, so that the stacked structure integrates more functional components, thereby reducing an area occupied by a non-display component on the substrate.

When the stacked structure provided in this embodiment of this disclosure is formed by stacking the drive chip and the pixel unit, an area occupied by the light-emitting unit on the substrate can be effectively reduced. To intuitively understand an effect of the stacked structure, the stacked structure provided in this embodiment of this disclosure is compared with a stacked structure in the conventional technology. The following describes the stacked structure in this disclosure and the stacked structure in the conventional technology with reference to FIG. 6 and FIG. 7. For ease of understanding, a comparison in a length direction is used to describe differences between the two stacked structures.

Figure 6:
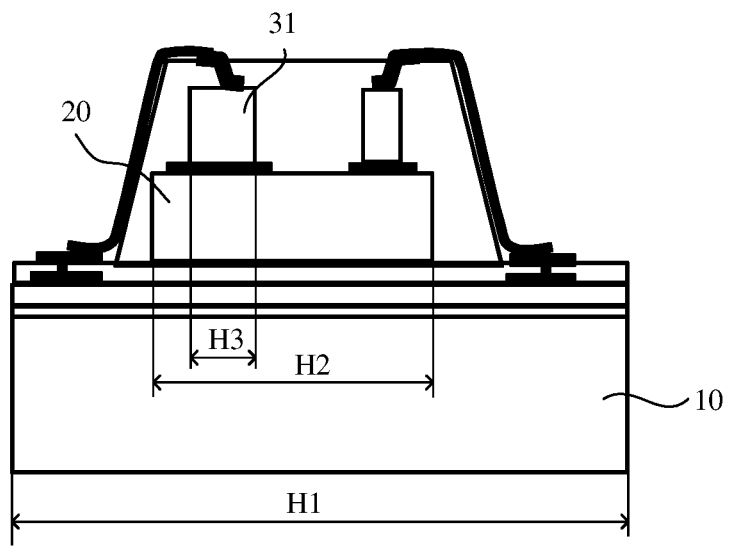
FIG. 6 is an example side view of a stacked structure according to an embodiment of this disclosure.

FIG. 6 is a side view of a stacked structure according to an embodiment of this disclosure. In the stacked structure, a length of the substrate 10 is H1, a length of the drive chip 20 is H2, and a length of the pixel unit (a length of the sub-pixel 31) is H3. A total length of the substrate 10 occupied by the light-emitting unit is H2, and a length occupied by a light-emitting part (the pixel unit) in the light-emitting unit is H3, so that a length occupied by a non-light-emitting part is H2-H3. It can be learned that, in the length direction of the substrate 10, a quantity of disposed light-emitting units may be determined based on values of H1 and H2.

Figure 7:
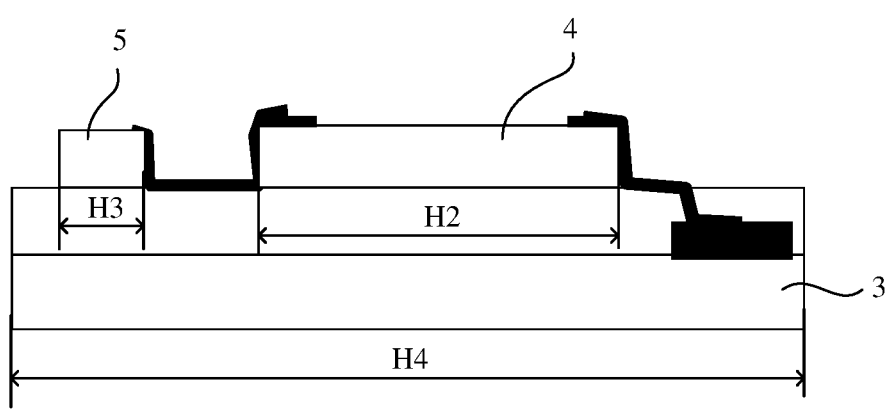
FIG. 7 is an example side view of a stacked structure in the conventional technology.

FIG. 7 is a side view of a stacked structure in the conventional technology. In the stacked structure, a length of a substrate 3 is H4, a length of a drive chip 4 is H2, and a length of a pixel unit (a length of a sub-pixel 6) is H3. It can be learned from FIG. 7 that, when the drive chip 4 and the pixel unit are disposed on a same layer on the substrate 3, a total length occupied by the light-emitting unit on the substrate 3 is H3+H2 (a size obtained after a gap between parts is removed). A length occupied by a light-emitting part (the pixel unit) of the light-emitting unit is H3, and a size occupied by a non-light-emitting part is H2. It can be learned that, in the length direction of the substrate 3, a quantity of disposed light-emitting units may be determined based on values of H4 and (H2+H3).

It can be learned from comparison between FIG. 6 and FIG. 7 that, on a substrate of a same size, a size occupied by the light-emitting unit in FIG. 7 is greater than a size occupied by the light-emitting unit in FIG. 6. In addition, in the light-emitting units shown in FIG. 6 and FIG. 7, a light-emitting part ratio H3/(H2+H3) in the light-emitting unit shown in FIG. 7 is less than a light-emitting part ratio H3/H2 in the light-emitting unit shown in FIG. 6. In addition, the size H2+H3 of the light-emitting unit in FIG. 7 is greater than the size H2 of the light-emitting unit shown in FIG. 6. Therefore, more light-emitting units shown in FIG. 6 may be disposed on the substrate of the same size. When the light-emitting unit is applied to the display screen, in a same display area, a quantity of the pixel units may be increased, thereby improving display precision of the display screen and improving a display effect.

To facilitate understanding of the stacked structure provided in this embodiment of this disclosure, the following describes a specific method for preparing the stacked structure in detail with reference to the accompanying drawings.

Step 001: Provide a substrate.

Figure 8A:
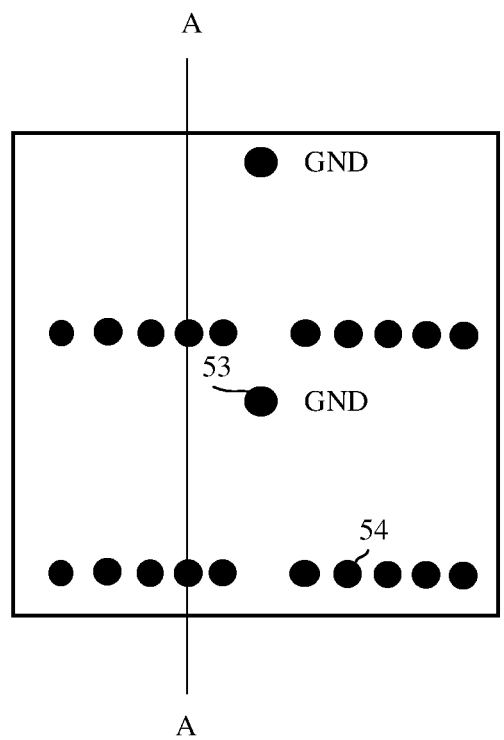
FIG. 8a is an example top view of a substrate during preparation of a stacked structure according to an embodiment of this disclosure.
Figure 8B:
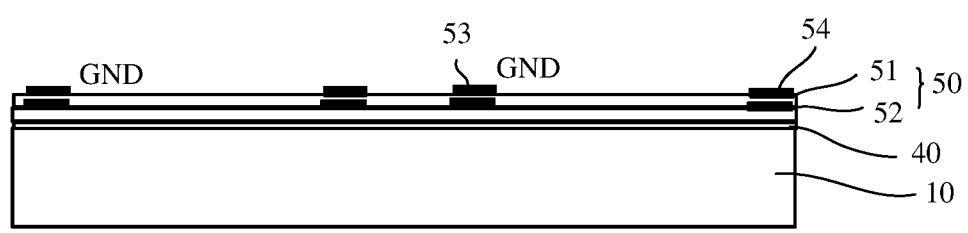

FIG. 8a is a top view of the substrate 10, and FIG. 8b is a sectional view of a line A-A in FIG. 8a. A line layer 50 and a separation layer 40 have been disposed on the substrate 10. Wiring and a pad (not shown in the figures) of the line layer 50 for connecting to a DDIC control signal have been completely processed. The separation layer 40 between the line layer 50 and the substrate 10 is made of a laser sacrificial layer material. The line layer 50 has an IO pad 54 and a GND pad 53. The IO pad 54 is made of In with a thickness of 3 μm, and the GND pad 53 is made of Au with a thickness of 0.05 μm. A same plating layer structure may be used to connect the DDIC wiring and a pad plating layer.

Step 002: Dispose a drive chip.

Figure 9A:
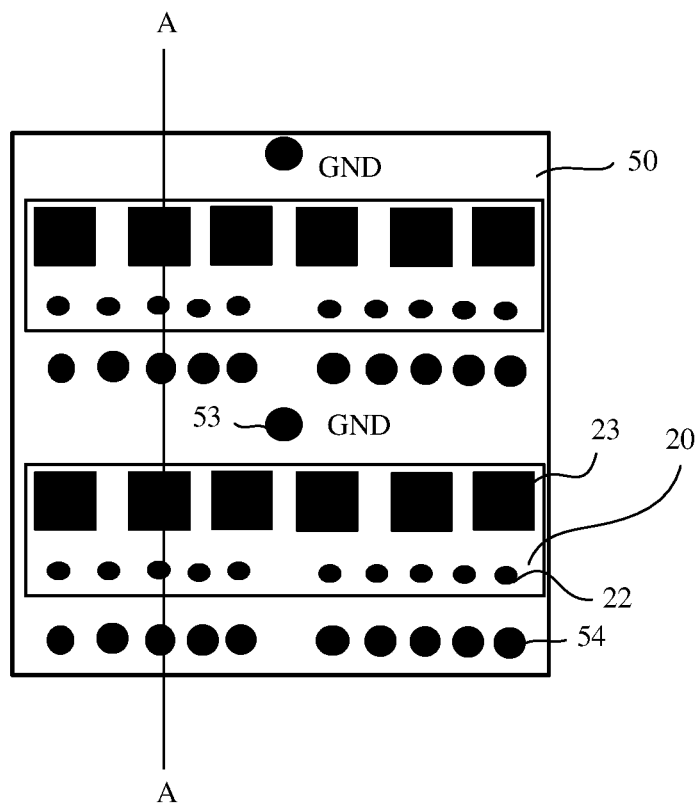
FIG. 9a is an example top view of a component during preparation of a stacked structure according to an embodiment of this disclosure.
Figure 9B:
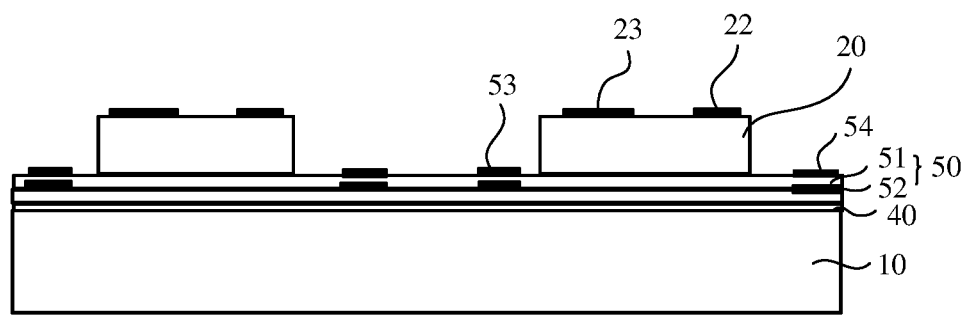

FIG. 9a is a top view of a component, and FIG. 9b is a sectional view of a line A-A in FIG. 9a. For some reference numerals in FIG. 9a and FIG. 9b, refer to the same reference numerals in FIG. 8a and FIG. 8b. The drive chip 20 is assembled onto the line layer 50 by using the transfer process and a die attach process. The transfer process may use a laser transfer manner or a physical transfer manner according to a wafer manufacturing process. The drive chip 20 is fixed on a line through film or adhesive die attach, and the IO pad 22 and the P pad 23 of the drive chip 20 face upward (a placement direction of the substrate 10 in FIG. 9b is used as a reference direction).

Step 003: Dispose a sub-pixel.

Figure 10A:
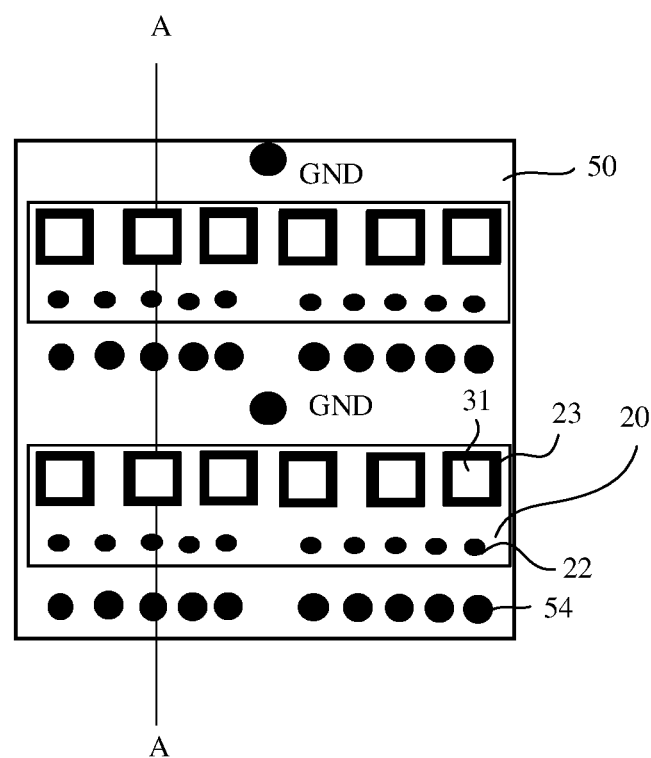
FIG. 10a is an example top view of a component during preparation of a stacked structure according to an embodiment of this disclosure.
Figure 10B:
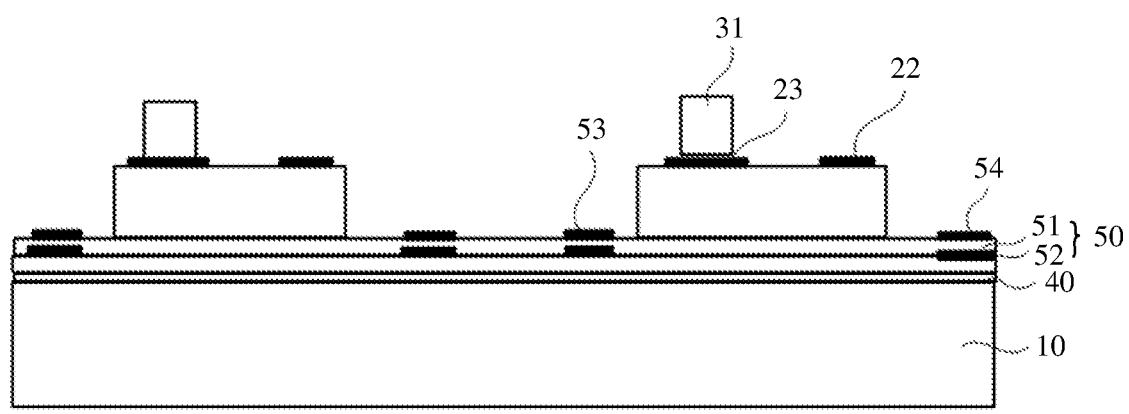

FIG. 10a is a top view of a component, and FIG. 10b is a sectional view of a line A-A in FIG. 10a. For some reference numerals in FIG. 10a and FIG. 10b, refer to the same reference numerals in FIG. 9a and FIG. 9b. The sub-pixel 31 uses the vertical structure shown in FIG. 4. The sub-pixel 31 is assembled on a surface of the drive chip 20 by using the transfer process and the bonding process. A P pole (positive pole) of the sub-pixel 31 is connected to the P pad 23 of the drive chip 20.

Step 004: Prepare a packaging layer.

Figure 11A:
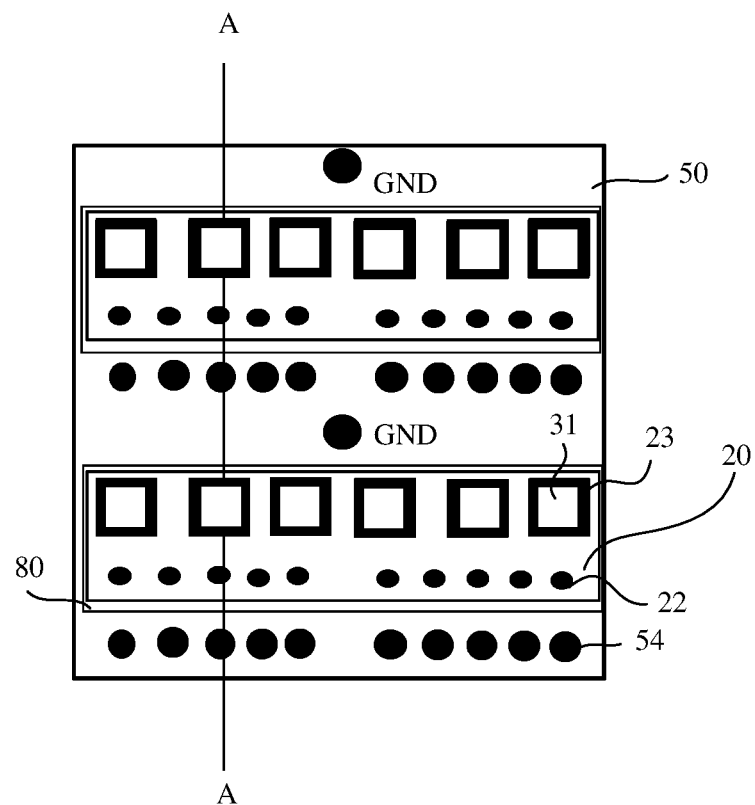
FIG. 11a is an example top view of a component during preparation of a stacked structure according to an embodiment of this disclosure.
Figure 11B:
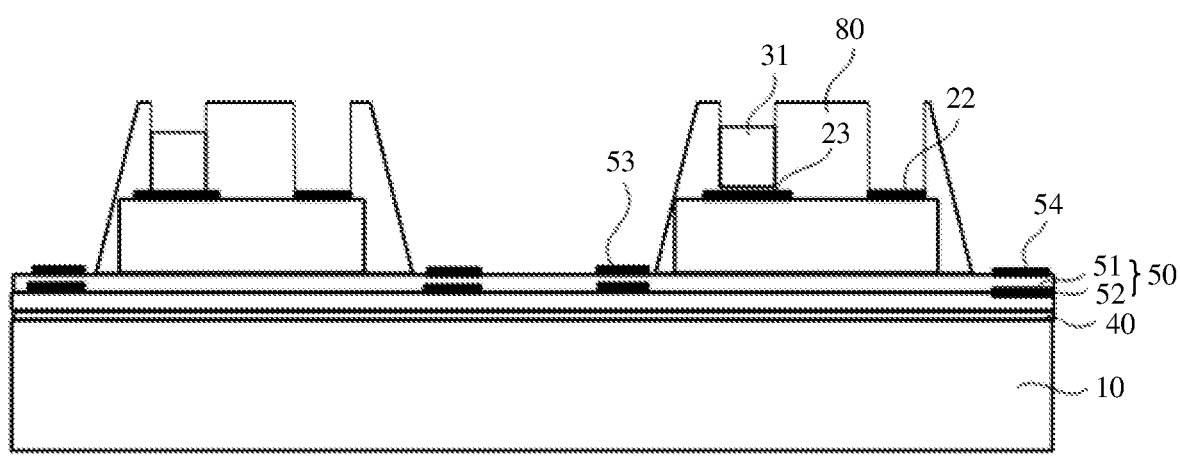

FIG. 11a is a top view of a component, and FIG. 11b is a sectional view of a line A-A in FIG. 11a. For some reference numerals in FIG. 11a and FIG. 11b, refer to the same reference numerals in FIG. 10a and FIG. 10b. The sub-pixel 31 and the drive chip 20 are packaged by using a PLN (Planarization) printing process to form a second packaging layer 80, and a negative pole (N pole) of the sub-pixel 31 and the IO pad 22 of the drive chip 20 are exposed by using a photolithography process. A material of the second packaging layer 80 is a transparent material, which may be specifically a COF (usually referred to as chip on film) material, may be a transparent photoresist material, or may be another transparent epoxy resin material.

Step 005: Perform fanout and wiring.

Figure 12A:
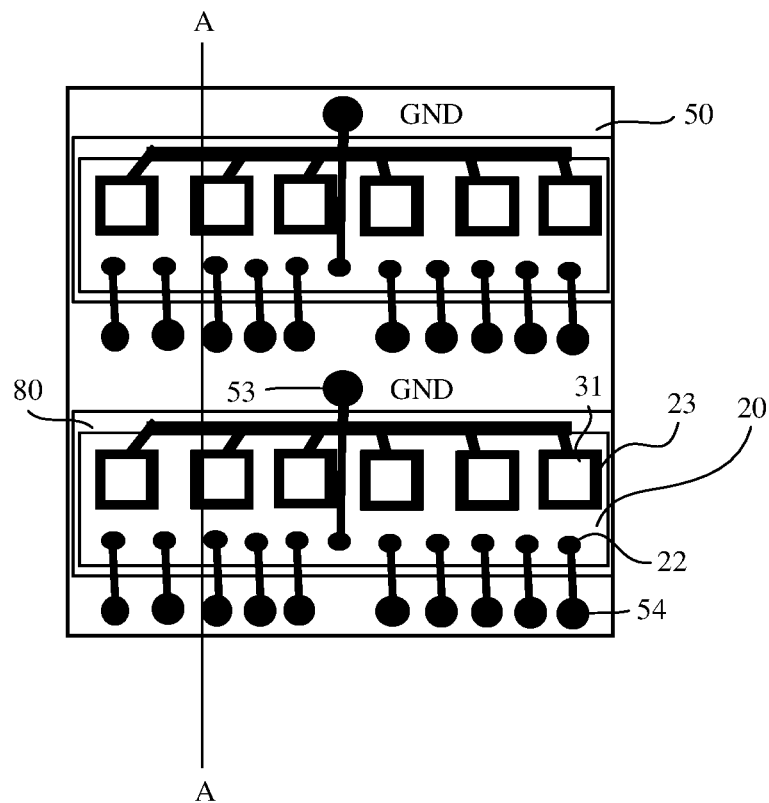
FIG. 12a is an example top view of a component during preparation of a stacked structure according to an embodiment of this disclosure.
Figure 12B:
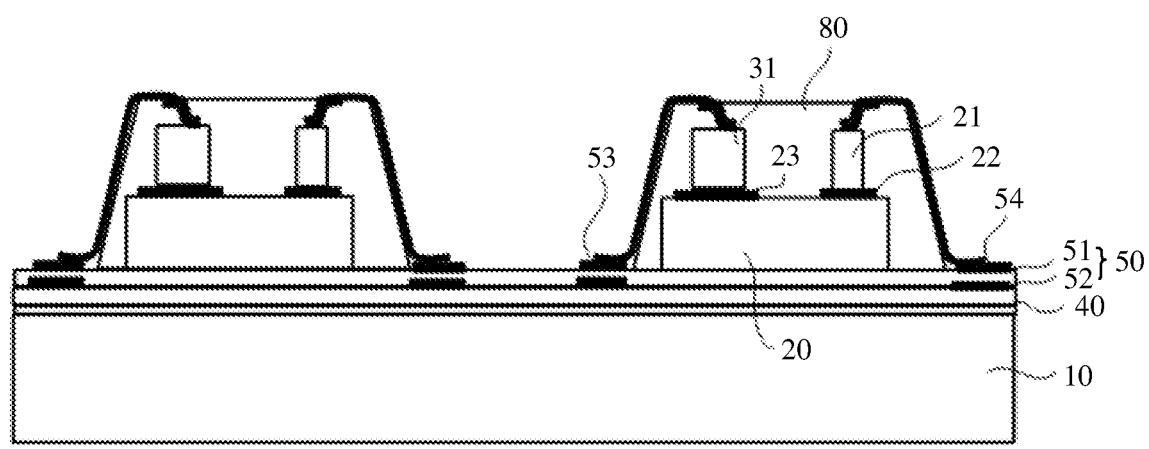

FIG. 12a is a top view of a component, and FIG. 12b is a sectional view of a line A-A in FIG. 12a. For some reference numerals in FIG. 12a and FIG. 12b, refer to the same reference numerals in FIG. 11a and FIG. 11b. Wiring of the IO pad 22 of the drive chip 20 is routed to a signal pad on a module surface (specifically, by disposing a binding post 21) by using the fanout process. A negative pole of each sub-pixel 31 is connected to the GND pad 54 of the line layer 50. A ground of the drive chip 20 is connected to a ground of the sub-pixel 31, and is connected to a ground of the display screen to connect all signal pins. Connection and wiring between the drive chip 20 and the line layer 50 may use a μbump (micro bump) process, which may be a Cu, an Al, or an ITO line process.

Step 006: Perform a test.

Specifically, a lighting test is performed on the stacked structure by using the DDIC. If there is a defective light-emitting unit, a position of the defective light-emitting unit is located.

Step 007: Cut the defective light-emitting unit.

Figure 13:
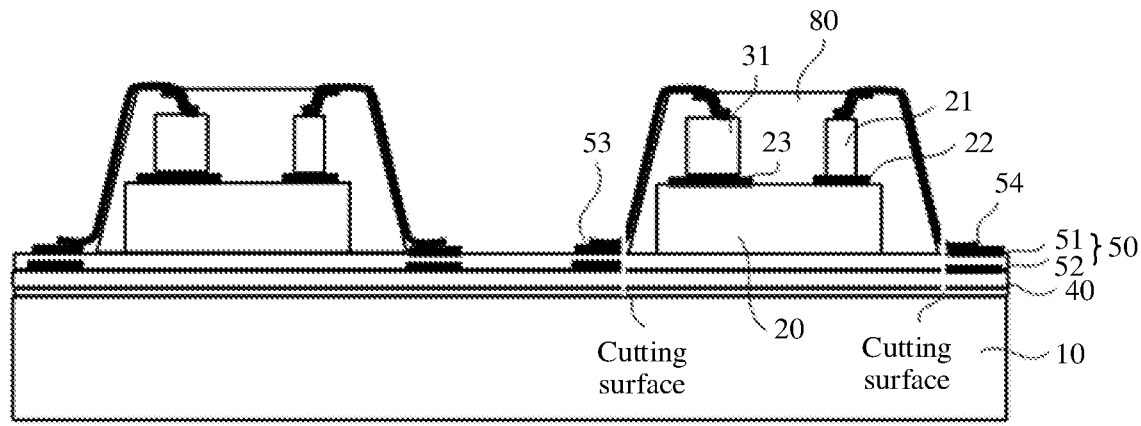
FIG. 13 to FIG. 17 are example flowcharts of preparing a stacked structure according to an embodiment of this disclosure.

As shown in FIG. 13, for some numerals in FIG. 13, refer to the same reference numerals in FIG. 12b. The defective light-emitting unit is cut by using a laser. The laser cuts the line layer 50 and the separation layer 40, so that the defective light-emitting unit is split.

Step 008: Remove the defective light-emitting unit.

Figure 14:
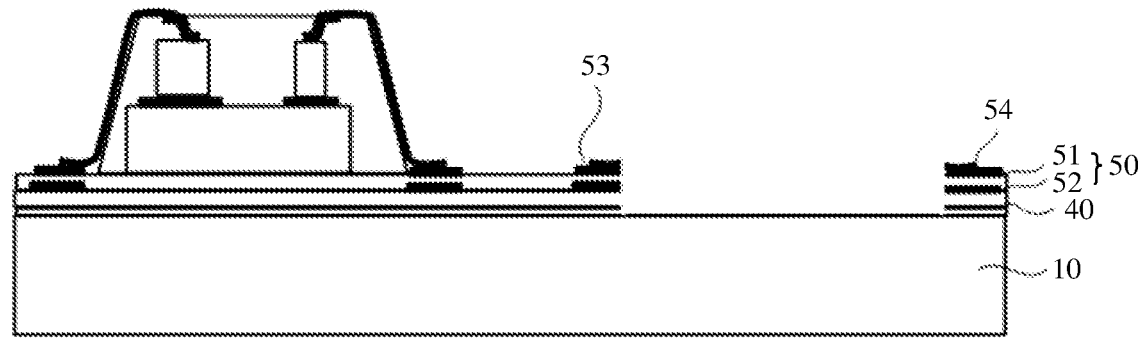

As shown in FIG. 14, for some numerals in FIG. 14, refer to the same reference numerals in FIG. 12b. The defective light-emitting unit is removed from the substrate 10 by performing laser ablation on the separation layer 40 on the surface of the substrate 10.

Step 009: Transfer and fix the light-emitting unit at the defective position.

Figure 15:
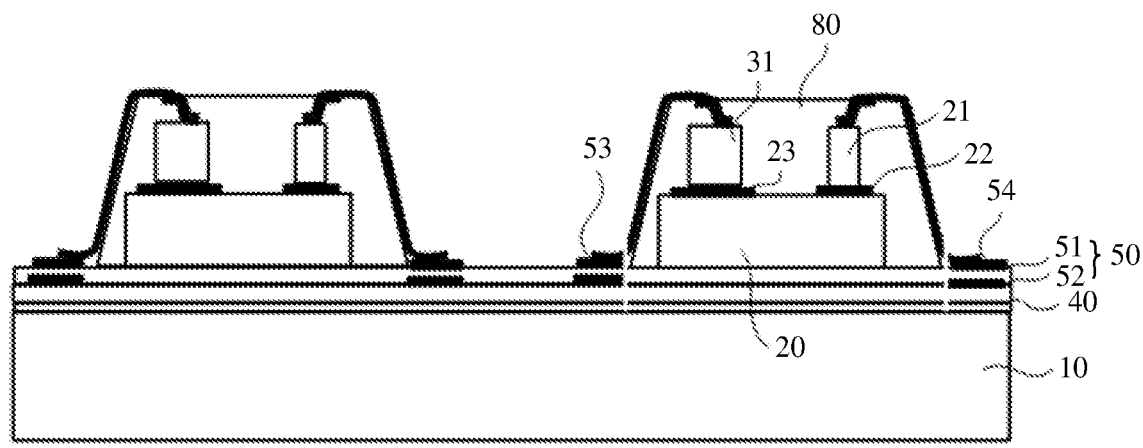

As shown in FIG. 15, for some numerals in FIG. 15, refer to the same reference numerals in FIG. 12b. A qualified light-emitting unit is transferred to a blank position by using a maintenance device, and is cured and fixed to the substrate 10 in a heating or UV (ultraviolet) manner.

Step 010: Fill in a gap around the repaired light-emitting unit.

Figure 16:
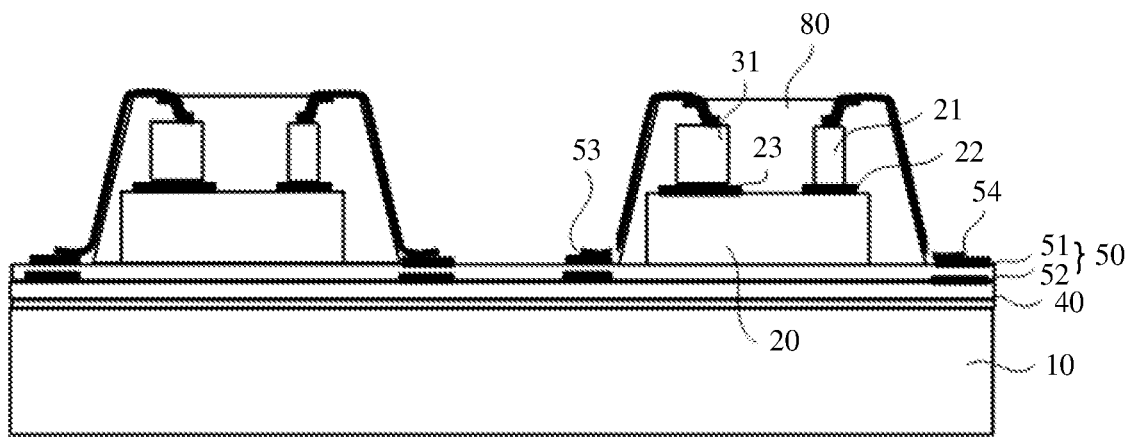

As shown in FIG. 16, for some numerals in FIG. 16, refer to the same reference numerals in FIG. 12b. A position of a gap around the repaired light-emitting unit is filled up and cured by using a printing device.

Step 011: Perform wiring to implement connection between the light-emitting unit and a line layer of the substrate.

Figure 17:
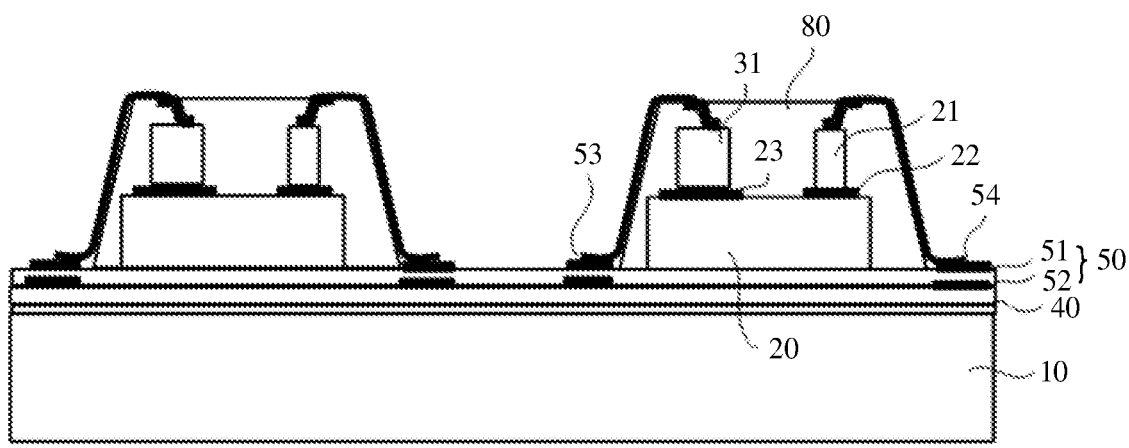

As shown in FIG. 17, for some numerals in FIG. 17, refer to the same reference numerals in FIG. 12b. Wiring of the light-emitting unit is connected to wiring of the line layer 50 by using a CVD (Chemical Vapor Deposition) or a silver paste printing solution, to implement continuity.

It can be learned from the foregoing description that, when the pixel unit and the drive chip are stacked, the drive chip and the pixel unit may be located at different layers, more drive chips may be arranged on the substrate, and more pixel units may also be arranged on the drive chips. The entire stacked structure may form an entire layer of pixel units, and the drive chips do not occupy an arrangement area of the pixel units, thereby increasing a quantity of the arranged pixel units, and further improving a display effect of the display screen. In addition, the light-emitting unit in the stacked structure may be replaced by using the separation layer during preparation, thereby improving reliability of the stacked structure during use.

Figure 18:
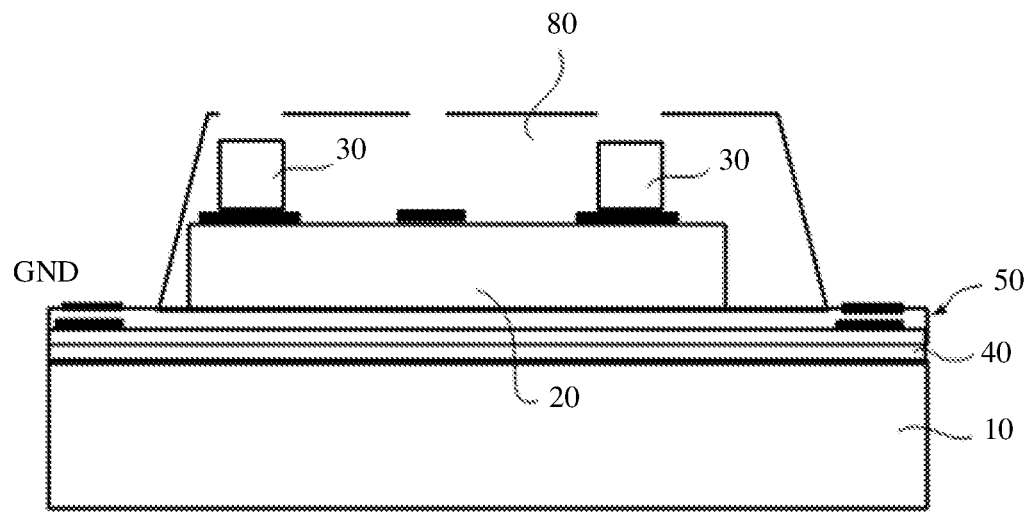
FIG. 18 is an example schematic diagram of another stacked structure according to an embodiment of this disclosure.

When the sub-pixels are directly disposed in the drive chips 20, the sub-pixels may be arranged in a single row, or may be arranged in two rows. As shown in FIG. 18, each drive chip 20 carries two rows of sub-pixels 31, but a vertical projection of each sub-pixel on the first surface is located in a vertical projection of the drive chip on the first surface. The first surface is a surface that is of the substrate and that faces the line layer.

Figure 19:
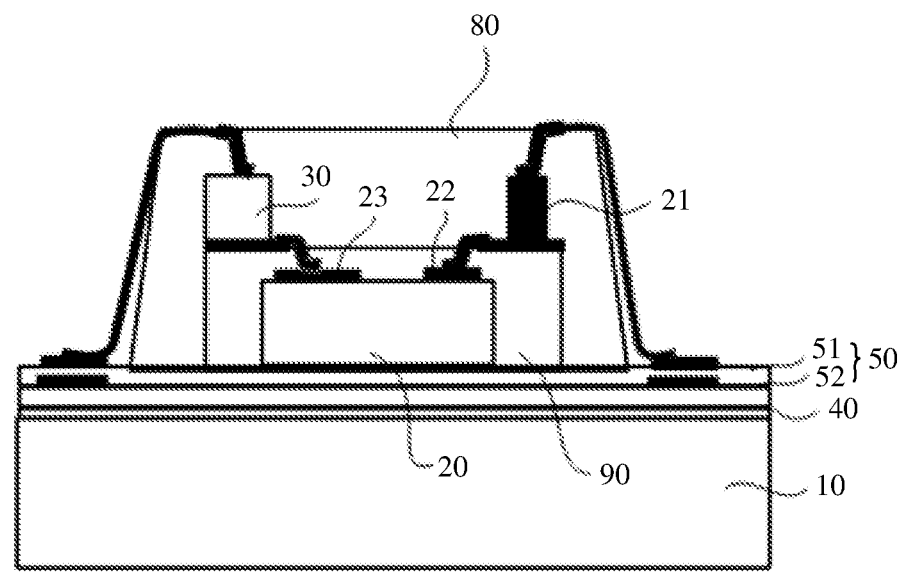
FIG. 19 is an example schematic diagram of a structure of another stacked structure according to an embodiment of this disclosure.

FIG. 19 shows an example of another stacked structure according to an embodiment of this disclosure. For some reference numerals in FIG. 19, refer to the same reference numerals in FIG. 3. This stacked structure differs from the stacked structure shown in FIG. 3 in that a position for disposing the sub-pixel 31 is changed. The stacked structure shown in FIG. 19 includes a first packaging layer 90. Each drive chip 20 on the substrate 10 corresponds to one first packaging layer 90. Each first packaging layer 90 packages the corresponding drive chip 20, and a plurality of sub-pixels 31 corresponding to each drive chip 20 are disposed on the first packaging layer 90.

In an optional solution, vertical projections of the plurality of sub-pixels 31 on the first surface are located in a vertical projection of the drive chip 20 on the first surface. The first surface is the surface that is of the substrate 10 and that faces the line layer 50.

Figure 20:
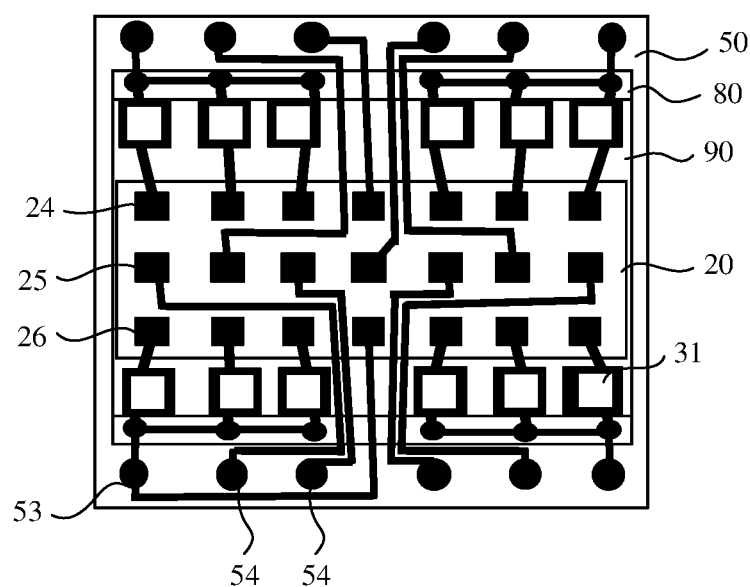
FIG. 20 is an example top view of another stacked structure according to an embodiment of this disclosure.

The first packaging layer 90 shown in FIG. 19 uses a rectangular structure in a cuboid shape. When the sub-pixels 31 are disposed on the first packaging layer 90, compared with a manner shown in FIG. 3 in which the sub-pixels 31 are directly disposed on the drive chip 20, a manner of disposing the sub-pixels 31 shown in FIG. 19 increases a quantity of the sub-pixels 31 carried by each drive chip 20. For ease of understanding the differences between the two stacked structures, refer to FIG. 2 and FIG. 20. FIG. 20 is an example top view in which a drive chip carries a plurality of pixel units 30. In FIG. 2, under impact of a size of the drive chip 20, only pixel units 30 arranged in a single row can be disposed on the drive chip 20. In the structure shown in FIG. 20, because the first packaging layer 90 expands an area for disposing the pixel units 30, the drive chip 20 may correspond to a plurality of pixel units 30, and the plurality of pixel units 30 are arranged in two rows, thereby increasing the quantity of the pixel units 30 corresponding to the drive chip 20. As shown in FIG. 20, four pixel units 30 are distributed at four corners of a drive chip 20, and are connected to the drive chip 20 through wiring, to ensure that one drive chip 20 controls four pixel units 30. This can reduce the quantity of the disposed drive chips 20, increase the quantity of the pixel units 30 in the display screen, and improve a display effect of the display screen.

In FIG. 20, three rows of connection ports 24, 25, and 26 are disposed in each drive chip 20. A middle row of connection ports 25 is connected to a binding post, and two rows of connection ports 24 and 26 on two sides are separately connected to the sub-pixels 31 in the pixel units 30. During implementation of electrical connection, the middle binding post is connected to the IO pad 54 of the line layer 50, and each sub-pixel 31 is connected to the GND pad 53 of the line layer 50. In FIG. 20, the sub-pixels 31 of each drive chip 20 are connected in parallel, and then are connected to the line layer 50. However, FIG. 20 shows only a specific example, and another connection manner may be alternatively used. For example, the sub-pixels 31 of each drive chip 20 are separately connected to the line layer 50. In this case, the sub-pixels 31 of different colors may be separately controlled to emit light. In addition, it should be understood that the foregoing describes only an example of a specific connection manner between the sub-pixels 31 and the line layer 50. The stacked structure provided in this embodiment of this disclosure may alternatively implement control of the sub-pixels 31 by the line layer 50 in another connection manner, which is not specifically limited in this disclosure.

For a method for preparing the stacked structure shown in FIG. 19, refer to the method for preparing the stacked structure shown in FIG. 3. The only difference lies in that a process of preparing the first packaging layer 90 is added. After the drive chip 20 is prepared, the drive chip 20 may be packaged by using the PLN printing process, and an IO pad and a P pad of the drive chip 20 are exposed by using the photolithography process. The PLN material may be a transparent material or may be a non-transparent material. When the transparent material is used, a material of the first packaging layer 90 may be a same material as that of the second packaging layer, for example, a COF material, or may be a transparent photoresist material or another transparent epoxy resin material. When the sub-pixels 31 are prepared, the sub-pixels 31 are prepared on the first packaging layer 90, and the sub-pixels 31 are connected to the drive chip 20 through wiring.

It can be learned from the foregoing description that, in the stacked structure provided in this embodiment of this disclosure, sub-pixels of the light-emitting unit are stacked above the drive chip 20 and placed in two layers. For limited space inside the display screen, a size of pixels (a light-emitting unit) of three colors R, G, and B may be made to 30×30 µm at a minimum. Compared with conventional non-stacked placement, the pixels of three colors R, G, and B have a minimum size of 50×50 µm. In addition, the separation layer may react in a laser or chemical corrosion manner, and the damaged pixel module is exfoliated. The GND and the IO pad circuit may be conveniently maintained, so that the damaged pixel module is replaced with a perfect pixel module.

In the display screen, under a high ppi (Pixels Per Inch) arrangement condition, a sub-pixel of a smaller size needs to be selected. Correspondingly, a spacing between two pads (the N pole and the P pole) of a sub-pixel of a flip chip type is further reduced. In this case, bonding easily causes a short circuit due to side overflow of the pad. In this solution, a vertical sub-pixel is used, and bonding is separately performed on two poles (the N pole and the P pole), so that the foregoing case is avoided. In addition, a vertical sub-pixel is used in this embodiment of this disclosure. When it is ensured that a light-emitting area of the vertical sub-pixel is consistent (a light-emitting area of the sub-pixel of a flip chip type occupies only approximately 50% of a total area of the sub-pixel, and a light-emitting area of the vertical sub-pixel occupies approximately 100% of the total area of the sub-pixel), the vertical sub-pixel reduces a component area. Therefore, under a same ppi and brightness, a sub-pixel occupies a smaller area. Using this characteristic may maximize a ppi limit. When the ppi limit is not reached, transparent display may be implemented or another miniature component may be integrated.

An embodiment of this disclosure further provides a display screen. The display screen includes a housing and the stacked structure that is disposed inside the housing and that is described in any one of the foregoing solutions. It can be learned from the foregoing description that, when the pixel unit and the drive chip are stacked, the drive chip and the pixel unit may be located at different layers, more drive chips may be arranged on the substrate, and more pixel units may also be arranged on the drive chips. The entire stacked structure may form an entire layer of pixel units, and the drive chips do not occupy an arrangement area of the pixel units, thereby increasing a quantity of the arranged pixel units, and further improving a display effect of the display screen.

An embodiment of this disclosure further provides a display apparatus. The display apparatus includes a body and the stacked structure that is disposed inside the body and that is described in any one of the foregoing solutions. It can be learned from the foregoing description that, when the pixel unit and the drive chip are stacked, the drive chip and the pixel unit may be located at different layers, more drive chips may be arranged on the substrate, and more pixel units may also be arranged on the drive chips. The entire stacked structure may form an entire layer of pixel units, and the drive chips do not occupy an arrangement area of the pixel units, thereby increasing a quantity of the arranged pixel units, and further improving a display effect of the display screen.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. A stacked structure, comprising:
   a substrate;
   at least one drive chip; and
   at least one pixel unit corresponding to each drive chip that are stacked, wherein
      the substrate includes a first surface, and a line layer is disposed on the first surface of the substrate;
      each drive chip is disposed on a surface of the line layer that faces away from the first surface;
      each pixel unit and a corresponding drive chip are stacked; and
      a sub-pixel located in each pixel unit is separately electrically connected to the line layer and the corresponding drive chip to form a light-emitting loop.

2. The stacked structure according to claim 1, wherein an area in which the drive chip is disposed on the line layer is insulated from the drive chip.

3. The stacked structure according to claim 2, wherein a binding post is disposed on the surface of each drive chip that faces away from the line layer, and the binding post is electrically connected to the drive chip and the line layer.

4. The stacked structure according to claim 1, wherein the sub-pixel corresponding to each drive chip is disposed on the surface of the corresponding drive chip that faces away from the line layer.

5. The stacked structure according to claim 4, further comprising:
   a first packaging layer corresponding to each drive chip, wherein
      each first packaging layer packages the corresponding drive chip, and
      the sub-pixel corresponding to each drive chip is disposed on the first packaging layer.

6. The stacked structure according to claim 1, further comprising:
   a second packaging layer corresponding to each drive chip, wherein
      each second packaging layer packages the corresponding drive chip and a plurality of sub-pixels.

7. The stacked structure according to claim 1, further comprising:
   a separation layer disposed between the line layer and the substrate.

8. The stacked structure according to claim 1, wherein
   each sub-pixel comprises a light-emitting layer and a P pole and an N pole that are separately connected to the light-emitting layer,
   the P pole is connected to the corresponding drive chip, and the N pole is connected to the line layer, or
   the P pole is connected to the line layer, and the N pole is connected to the corresponding drive chip.

9. The stacked structure according to claim 8, wherein the P pole, the light-emitting layer, and the N pole are stacked, and the light-emitting layer is located between the P pole and the N pole.

10. The stacked structure according to claim 8, wherein the P pole, the light-emitting layer, and the N pole are stacked, and the P pole and the N pole are disposed on a same layer.

11. A display screen, comprising:
    a housing; and
    a stacked structure disposed inside the housing, wherein the stacked structure comprises:
       a substrate;
       a plurality of drive chips; and
       a plurality of pixel units corresponding to each drive chip, wherein
          the substrate includes a first surface, and a line layer is disposed on the first surface of the substrate;
          each drive chip is disposed on a surface of the line layer that faces away from the first surface;
          each pixel unit and a corresponding drive chip are stacked; and
          a sub-pixel located in each pixel unit is separately electrically connected to the line layer and the corresponding drive chip to form a light-emitting loop.

12. A display apparatus, comprising:
    a body; and
    a stacked structure disposed inside the body, wherein the stacked structure comprises:
       a substrate;
       a drive chip; and
       a pixel unit corresponding to the drive chip, wherein
          the substrate includes a first surface, and a line layer is disposed on the first surface of the substrate;
          the drive chip is disposed on a surface of the line layer that faces away from the first surface; and
          a sub-pixel located in the pixel unit is separately electrically connected to the line layer and the corresponding drive chip to form a light-emitting loop.

13. The display screen of claim 11, wherein the sub-pixel corresponding to each drive chip is disposed on the surface of the corresponding drive chip that faces away from the line layer.

14. The display apparatus of claim 12, wherein the sub-pixel corresponding to each drive chip is disposed on the surface of the corresponding drive chip that faces away from the line layer.

15. The display screen of claim 11, wherein the stacked structure further comprises:
    a second packaging layer corresponding to each drive chip, wherein
       each second packaging layer packages the corresponding drive chip and a plurality of sub-pixels.

16. The display apparatus of claim 12, wherein the stacked structure further comprises:
    a second packaging layer corresponding to each drive chip, wherein
    each second packaging layer packages the corresponding drive chip and a plurality of sub-pixels.

17. The display screen of claim 11, wherein
    each sub-pixel comprises a light-emitting layer and a P pole and an N pole that are separately connected to the light-emitting layer,
    the P pole is connected to the corresponding drive chip, and the N pole is connected to the line layer, or
    the P pole is connected to the line layer, and the N pole is connected to the corresponding drive chip.

18. The display apparatus of claim 12, wherein
each sub-pixel comprises a light-emitting layer and a P pole and an N pole that are separately connected to the light-emitting layer,
the P pole is connected to the corresponding drive chip, and the N pole is connected to the line layer, or
the P pole is connected to the line layer, and the N pole is connected to the corresponding drive chip.

19. The stacked structure according to claim 1, wherein
each sub-pixel includes a light-emitting layer, and a P pole and an N pole, and
the P pole and the N pole are separately connected to the light-emitting layer.

20. The stacked structure according to claim 1, wherein
the substrate has a length H1,
the at least one drive chip has a length H2,
the at least one pixel unit has a length H3, and
a length occupied by a non-light-emitting part is represented as H2-H3.

\* \* \* \* \*